United States Patent [19]

Hillenkamp et al.

[11] 4,214,159
[45] Jul. 22, 1980

[54] APPARATUS FOR ANALYZING SAMPLES BY ELECTROMAGNETIC IRRADIATION

[75] Inventors: Franz Hillenkamp, Frankfurt; Raimund Kaufmann, Düsseldorf-Meerbush; Rainer Nitsche, Frankfurt; Eberhard Unsöld, Munich; Reiner Wechsung, Cologne, all of Fed. Rep. of Germany

[73] Assignee: Leybold-Heraeus GmbH, Köln-Bayental, Fed. Rep. of Germany

[21] Appl. No.: 938,491

[22] Filed: Aug. 31, 1978

[30] Foreign Application Priority Data

Sep. 3, 1977 [DE] Fed. Rep. of Germany ....... 2739829

[51] Int. Cl.² .................. B01D 59/44; H01J 39/34
[52] U.S. Cl. .................................. 250/288; 250/423 P
[58] Field of Search ........... 250/281, 282, 288, 423 R, 250/423 P, 425, 503; 219/121 L, 121 LM

[56] References Cited

U.S. PATENT DOCUMENTS

| 3,406,349 | 10/1968 | Swain et al. .................. 250/423 P |
| 3,521,054 | 7/1970 | Poschenriedge et al. ........ 250/423 P |
| 3,644,731 | 2/1972 | Eloy ................................. 250/288 |
| 4,001,582 | 1/1977 | Castaing et al. ................ 250/288 |

*Primary Examiner*—Bruce C. Anderson
*Attorney, Agent, or Firm*—Spencer & Kaye

[57] ABSTRACT

An apparatus for analyzing a sample by electromagnetic irradiation includes a vacuum chamber, a support for holding the sample in the vacuum chamber, an arrangement for irradiating the sample with an electromagnetic beam, a mass analyzer disposed in the vacuum chamber, an arrangement for extracting particles from the sample and introducing them into the mass analyzer and a layer of conductive material situated in the vicinity of support in the zone of the sample.

20 Claims, 3 Drawing Figures

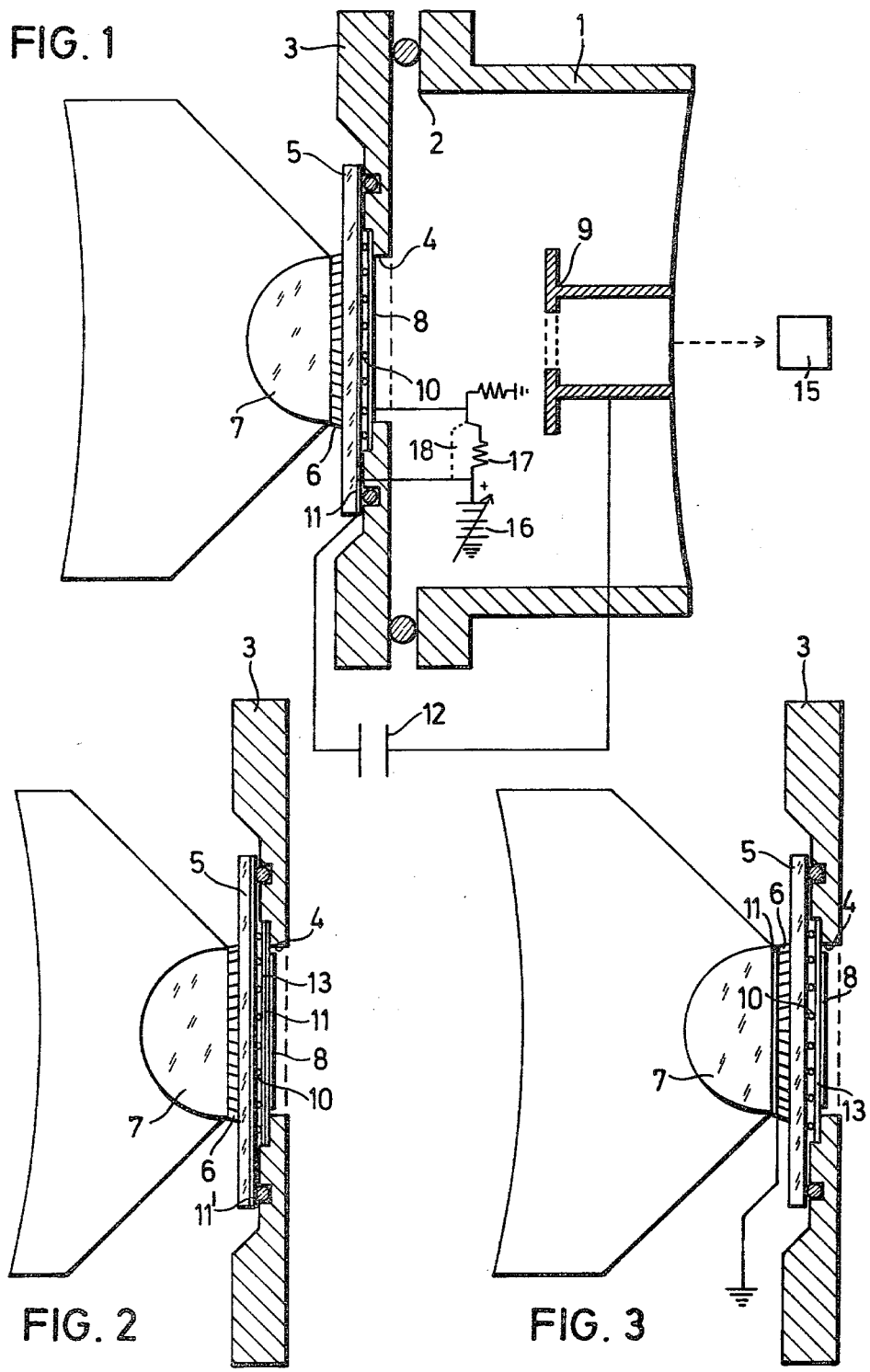

APPARATUS FOR ANALYZING SAMPLES BY ELECTROMAGNETIC IRRADIATION

BACKGROUND OF THE INVENTION

The present invention relates to an apparatus for analyzing a sample by electromagnetic irradiation and subsequently examining the particles emitted from the sample with the aid of a mass analyzer which forms part of the apparatus and which is accommodated in a vacuum chamber.

An apparatus of the above-outlined type is known and is disclosed, for example, in German Laid-Open Application (Offenlegungsschrift) No. 1,598,632. In this conventional arrangement, part of the sample is evaporated and ionized with the aid of high-energy electromagnetic radiation, in particular laser radiation, so that the location of impingement of the electromagnetic radiation can be used as an ion source for mass spectroscopy. In order to be able to extract the ions from the sample in the direction of the mass analyzer or in the direction of an electrode system disposed upstream of the mass analyzer, a suitable electrical potential difference must exist between the sample and the mass analyzer or the electrode upstream thereof. In this connection, reference is made to German Laid-Open Application (Offenlegungsschrift) No. 2,540,505. For an accurate analysis of the ion mass, it is of importance that this potential difference be the same, as closely as possible, for all ions emitted by the sample. This, for example, is no longer the case if, due to the emission of ions by the sample, the electrical potential changes at the locus of the evaporation of the sample material. The velocity of the ions reaching the mass analyzer then no longer corresponds to the applied accelerating voltage, but to the actual voltage difference between the locus of evaporation and the mass analyzer. Such a voltage difference is not known precisely and is not reproducible. Ions of the same mass can therefore enter the mass analyzer at different velocities which considerably worsens the resolution or even leads to measuring errors. The greater the energy of the laser pulse, and thus the number of ions generated, and the less the area of the sample under bombardment as well as the conductivity of the sample material, the greater such errors will become. The time required to compensate for this local charge must be short compared to the time of the actual measuring process.

SUMMARY OF THE INVENTION

It is an object of the present invention to provide an apparatus of the above-mentioned type in which the described drawbacks no longer occur.

This object and others to become apparent as the specification progresses, are accomplished by the invention, according to which, briefly stated, an electrically conductive layer of material is disposed in the zone of the sample.

Such a layer of conductive material which is preferably at the potential of the sample, ensures a completely even potential distribution in the zone of the sample. Such a layer effects a rapid charge equalization, so that always the same potential difference is determinative for the ions emitted from the sample and accelerated in the direction of the mass analyzer. Further, external potentials are prevented from having an influence on the locus of the analysis.

In case the apparatus conventionally has a glass-covered opening in one of the walls of the housing and an optical focusing system at the exterior of the covering glass for focusing the electromagnetic radiation through the covering glass onto the sample disposed below the housing, then the conductive layer, which is disposed preferably between the focusing system and the sample, is expediently essentially transparent, so that the electromagnetic radiation can reach the sample. The focusing system may then also serve for observing the sample under top- or trans-illumination, for example, in order to adjust the locus of analysis.

The layer of conductive material may be disposed on various components in the zone of the sample. It may be applied, for example, by vapor-deposition, to the side of the focusing system facing the sample or to the covering glass. Since the covering glass is often exchanged together with the sample, applying the conductive layer to the frontal face of the focusing system has certain advantages, at least with respect to the potential distribution.

In the alternative, it is also feasible to dispose the layer of conductive material on a carrier foil for the sample or, the entire carrier foil for the sample may be made of the conductive material. Or, the conductive layer may be vapor-deposited on the sample itself.

According to a further feature of the invention, the conductive layer is blocked with respect to the electrode (which extracts the ions) with a high capacitance and preferably a low inductance. Such an arrangement particularly enhances a prevention of change in potential by charge separation in the zone of the sample.

It is particularly expedient if the sample and the conductive layer have the same potential and are electrically insulated from the other components in the zone of the sample. Thus, a high positive or negative voltage may be applied to the sample, depending on the charge sign of the particles to be analyzed. This permits the use of a mass separation system at ground potential. If the mass separation is effected with the aid of a time-of-flight tube, this tube may be of simple construction since the heretofore required complex high-voltage insulation is no longer necessary. The above-mentioned measure also makes it possible to leave the mass separation system at the conventional negative or positive high voltage potential. This then doubles the acceleration voltage.

It is a further feature of the invention to arrange the layer of conductive material separately and insulate it electrically. This permits setting of a potential which is different from that of the sample, so that a further influencing of the field near the sample is feasible. By a suitable selection of the potential it is furthermore possible to extract not only ions but also electrons from the area between the sample and the conductive layer and to use them, for example, for calibrating the measured signal, since the number of the electrons is related to the number of ions generated and their degree of ionization. This extraction of ions or electrons can also take place between two electrically conductive layers disposed in the zone of the sample. Faster and weaker signals should then advisably be recorded by means of an arrangement having a low capacitance.

According to a further feature of the invention, a mesh is disposed between the covering glass and the sample. The mesh serves as a spacer and ensures that the covering glass is not also evaporated. The mesh may be made of a conductive or nonconductive material. If it is made of conductive material, it is preferably in electrical contact with the layer of conductive material to contribute to a rapid equalization of charges. If it is made of nonconductive material, it provides for an electrical insulation of the conductive layer.

In some particular cases it may be advisable, in order to influence the field near the sample, to provide two layers of electrically conductive material so as to multiply the possibilities for affecting the field near the sample, for example, for optimizing or adjusting purposes.

BRIEF DESCRIPTION OF THE DRAWINGS

FIGS. 1, 2 and 3 are schematic sectional views of three preferred embodiments of the invention.

DESCRIPTION OF THE PREFERRED EMBODIMENTS

Turning now to FIG. 1, the apparatus shown therein includes a housing 1 having an opening 2 that is sealed by means of a closure 3 in a vacuum-tight manner. The closure 3 has an opening 4 which is sealed—also in a vacuum-tight manner—by a covering glass 5. Outside the housing 1 there is arranged a focusing system which contacts the covering glass 5, preferably with the intermediary of a layer 6 constituted by an immersion liquid. Only the condenser lens 7 of the focusing system is shown. With the aid of the focusing system the electromagnetic (laser) beam is focused in the zone of a sample 8, so that an extremely small region of the sample is evaporated and ionized. The sample 8 is situated within the vacuum chamber 1 and is supported by the closure 3 in the opening 4 immediately behind the cover glass 5. The ionized sample particles with negative or positive charge are extracted by an electrode 9 which has a high positive or negative potential with respect to the sample 8 and which, for example, may simultaneously be designed as an ion lens. The ions enter a mass spectrometer 15 disposed in the vacuum chamber 1 and having a mass separator system, such as a time-of-flight tube. To assure that only the sample 8 is evaporated, with the exclusion of the covering glass 5, a spacer such as a mesh 10 is provided between the sample 8 and the covering glass 5. The thickness of the mesh 10 may be, for example, several tens of microns. It is further feasible to hold the sample between two meshes.

In the embodiment illustrated in FIG. 1, the side of the covering glass 5 facing the interior of the housing 1 is covered, according to the invention, with a layer of conductive material 11. The layer 11 is transparent to the ion generating laser radiation. The layer 11 ensures a uniform potential distribution in the zone of the sample, so that all ions traveling from the sample 8 to the electrode 9 are subjected to the same potential difference. The conductive layer 11 is blocked by a relatively large capacitance 12 with respect to the electrode 9 so that rapid charge equalization is assured. The inductance of the capacitance 12 should be as small as possible; preferably, it should be zero. If the spacer 10 is made of a conductive material (for example, if it is a copper mesh), it likewise contributes to the charge equalization since it is in direct contact with the conductive layer 11. The layer 11 and the sample 8 can have different potentials or identical high positive potentials, for example, 3000 V. For this purpose, a voltage source 16 is provided which is connected directly to the layer 11 and with the intermediary of a resistor 17, to the sample 8. If the resistor 17 is effective, the sample 8 and the layer 11 will have different potentials, but if the resistor 17 is bypassed as at 18, the potential on the sample 8 and the layer 11 will be identical. An electric insulation of the layer 11 is ensured by making the closure 3 and the mesh 10 of an insulating material.

Turning now to FIG. 2, the embodiment shown therein differs from the FIG. 1 embodiment in that the sample 8 is supported by a carrier foil 13 to which the conductive layer 11 is applied. In such an arrangement a further layer 11' may be additionally provided on the interior of the glass 5 as in the embodiment of FIG. 1. The additional layer 11' may have a different potential from those of layer 11 and sample 8. The mesh 10 and/or the foil 13 may serve as insulators in case they are made of electrically insulating material.

In the embodiment of FIG. 3, the conductive layer 11 according to the invention is at ground potential and is applied to that side of the focusing system which faces the sample 8. Such an arrangement is of advantage if during every change of samples, the covering glass and other elements also have to be exchanged. Thus, the conductive layer 11 being permanently present on the focusing system, the new covering glass or other new components need not be provided in each instance with the conductive layer. It is to be understood that any other potential may be applied to the layer 11 if desired.

The layer 11, may, for example, essentially consist of $In_2O_3-SnO_2$ or of a thin layer of carbon or gold. Its thickness and consistency should be so selected that it is still transparent for the laser radiation. If the layer 11 is disposed so close to the sample 8 that part of it is also evaporated, then this material can also be utilized to calibrate the mass spectrometer.

It will be understood that the above description of the present invention is susceptible to various modifications, changes and adaptations, and the same are intended to be comprehended within the meaning and range of equivalents in the appended claims.

What is claimed is:

1. In an apparatus for analyzing a sample by electromagnetic irradiation, including a vacuum chamber having an opening; a covering glass closing off said opening; support means for holding the sample in the vacuum chamber; said support means being arranged at said covering glass for positioning the sample immediately adjacent said covering glass; means for irradiating the sample with an electromagnetic beam including a focusing system arranged externally of said vacuum chamber at said covering glass for focusing the electromagnetic beam on the sample through said covering glass; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer being situated between the focusing system and the sample and extending along a face of said covering glass in the path of the beam; said layer being transparent to said beam.

2. An apparatus as defined in claim 1, further comprising means for applying identical potential to said layer and the sample and means for electrically insulating said layer and the sample from all other components in said zone.

3. An apparatus as defined in claim 1, further comprising means for applying identical high positive potential to said layer and the sample and means for electrically insulating said layer and the sample from all other components in said zone.

4. An apparatus as defined in claim 1, wherein said layer is electrically insulated from all other components.

5. In an apparatus for analyzing a sample by electromagnetic irradiation, including a vaccum chamber; support means for holding the sample in the vaccum chamber; means for irradiating the sample with an electromagnetic beam; a mass analyzer disposed in the vaccum chamber; means for extracting particles from the sample and introducing them into the mass analyzer; the improvement comprising a layer of conductive material situated in the vicinity of said support means in the zone of the sample for effecting an even potential distribution in the zone of the sample; said layer being carried by a component of said apparatus located in said zone.

6. An apparatus as defined in claim 5, wherein said layer is a vapor-deposited coating.

7. In an apparatus for analyzing a sample by electromagnetic irradiation, including a vacuum chamber; support means including a sample carrier foil for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said foil being coated with said layer.

8. In an apparatus for analyzing a sample by electromagnetic irradiation, including a vacuum chamber; support means including a sample carrier foil for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said sample carrier foil constituting said layer.

9. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer being a coating deposited on the sample.

10. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; and means including a high capacitance for blocking said layer with respect to the particle extracting means.

11. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; and means including a high capacitance and a low inductance for blocking said layer with respect to the particle extracting means.

12. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; and means for applying unlike potentials to said layer and the sample.

13. In an apparatus for analyzing a sample by electromagnetic irradiation, including a vacuum chamber having an opening; a covering glass closing off said opening; support means for holding the sample in the vacuum chamber; said support means being arranged at said covering glass for positioning the sample immediately adjacent said covering glass; means for irradiating the sample with an electromagnetic beam including a focusing system arranged externally of said vacuum chamber at said covering glass for focusing the electromagnetic beam on the sample through said covering glass; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer extending along a face of said covering glass in the path of the beam and being transparent to said beam; further comprising a spacer disposed between said covering glass and the sample.

14. An apparatus as defined in claim 13, wherein said spacer is a mesh.

15. An apparatus as defined in claim 13, wherein said spacer is an electrically conductive material.

16. An apparatus as defined in claim 13, wherein said spacer is an electrically insulating material.

17. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a plurality of layers of conductive material situated in the vicinity of said support means in the zone of the sample for effecting an even potential distribution in the zone of the sample.

18. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer essentially consisting of $In_2O_3$-$SnO_2$ and is of a thickness that is substantially transparent to the electromagnetic beam.

19. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer essentially consisting of carbon and is of a thickness that is substantially transparent to the electromagnetic beam.

20. In an apparatus for analyzing a sample by electromagnetic irradiation, including a vacuum chamber; support means for holding the sample in the vacuum chamber; means for irradiating the sample with an electromagnetic beam; a mass analyzer disposed in the vacuum chamber; means for extracting particles from the sample and introducing them into the mass analyzer; the improvement comprising a layer of conductive material situated in the vicinity of said support means in the zone of the sample for effecting an even potential distribution in the zone of the sample; said layer essentially consisting of gold and is of a thickness that is substantially transparent to the electromagnetic beam.

* * * * *